US010714012B2

(12) United States Patent
Dong

(10) Patent No.: US 10,714,012 B2
(45) Date of Patent: Jul. 14, 2020

(54) DISPLAY DEVICE, ARRAY SUBSTRATE, PIXEL CIRCUIT AND DRIVE METHOD THEREOF

(71) Applicant: BOE TECHNOLOGY GROUP CO., LTD., Beijing (CN)

(72) Inventor: Tian Dong, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 12 days.

(21) Appl. No.: 16/172,509

(22) Filed: Oct. 26, 2018

(65) Prior Publication Data

US 2019/0189057 A1 Jun. 20, 2019

(30) Foreign Application Priority Data

Dec. 14, 2017 (CN) .......................... 2017 1 1339732

(51) Int. Cl.
*G09G 3/3258* (2016.01)
*G09G 3/3233* (2016.01)
*H01L 51/52* (2006.01)

(52) U.S. Cl.
CPC ......... *G09G 3/3258* (2013.01); *G09G 3/3233* (2013.01); *H01L 51/5203* (2013.01);
(Continued)

(58) Field of Classification Search
CPC ...... G09G 3/32; G09G 3/3258; G09G 3/3233; H01L 51/5203
See application file for complete search history.

(56) References Cited

U.S. PATENT DOCUMENTS

2010/0127955 A1 5/2010 Choi
2019/0005877 A1* 1/2019 Dong .................. G09G 3/3208

FOREIGN PATENT DOCUMENTS

CN 103000126 A 3/2013
CN 104835452 A 8/2015
(Continued)

OTHER PUBLICATIONS

First Office Action for Chinese Patent Application No. 201711339732.3 dated Apr. 26, 2019.
(Continued)

*Primary Examiner* — Alexander Eisen
*Assistant Examiner* — Cory A Almeida
(74) *Attorney, Agent, or Firm* — Calfee, Halter & Griswold LLP

(57) ABSTRACT

A pixel circuit includes: a reset sub-circuit, configured to write an input voltage of a reset terminal into a first control point and write an input voltage of a reference power source terminal into a second control point; a drive control sub-circuit, configured to write an input voltage of a data terminal into the first control point; a power supply sub-circuit, configured to supply a voltage of a first power source terminal to the second control point and enable a third control point to communicate with a fourth control point; a storage sub-circuit, configured to store voltages of the first and second control points; a drive sub-circuit, configured to discharge electricity under the control of the voltages of the first and second control points; and a light-emitting element, configured to emit light under the control of a voltage of the fourth control point.

14 Claims, 6 Drawing Sheets

(52) U.S. Cl.
CPC ............... *G09G 2300/0819* (2013.01); *G09G 2300/0861* (2013.01); *G09G 2310/0251* (2013.01); *G09G 2310/0262* (2013.01)

(56) References Cited

FOREIGN PATENT DOCUMENTS

| | | | | | |
|---|---|---|---|---|---|
| CN | 105096831 A | | 11/2015 | | |
| CN | 105845081 A | * | 8/2016 | ........... | G09G 3/3208 |
| CN | 105845081 A | | 8/2016 | | |
| CN | 107342051 A | | 11/2017 | | |

OTHER PUBLICATIONS

Second Office Action for Chinese Patent Application No. 201711339732.3 dated Dec. 10, 2019.

* cited by examiner

DISPLAY DEVICE, ARRAY SUBSTRATE, PIXEL CIRCUIT AND DRIVE METHOD THEREOF

CROSS-REFERENCE

This application is based upon and claims priority to Chinese Patent Application No. 201711339732.3, filed on Dec. 14, 2017, the entire contents thereof are incorporated herein by reference.

TECHNICAL FIELD

The present disclosure relates to the field of display technologies, and more particularly, to a pixel circuit, a method for driving the pixel circuit, an array substrate, and a display device.

BACKGROUND

In active-matrix organic light emitting diode (AMOLED) display technologies, display brightness is in direct proportion to drive current of an OLED device. At the moment when the OLED device is turned on, a pixel circuit provides corresponding drive current for the OLED device to form a current path from power supply voltage ELVDD to a cathode ELVSS of the OLED. After the power supply voltage ELVDD is inputted from outside of an effective display area, the power supply voltage ELVDD is transferred to each pixel circuit through a wire within the effective display area. Because of certain resistance of the wire, the power supply voltage ELVDD may generate a direct-current voltage drop (generally referred to as IR drop) in the transfer process.

Existence of the IR drop leads to uneven distribution of the power supply voltage ELVDD within the effective display area. This is specifically because the actual power supply voltage of each pixel circuit is VDD_pixel=ELVDD−I*R, wherein I represents an electric current value of ELVDD signal network, and R represents an electric resistance of a wire from the pixel circuit to an input terminal of the power supply voltage ELVDD. The wires from each pixel circuit to the input terminal of the power supply voltage ELVDD have different lengths. Therefore, each wire has different electric resistances R, i.e., the IR drops are different. When a drive transistor has uneven saturation, each pixel circuit has different pixel currents, which causes nonuniform display. Furthermore, as display panels are increased in size, the problem of IR drop becomes increasingly severe, which leads to nonuniform panel display brightness.

Furthermore, drift of threshold voltage of the drive transistor in the pixel circuit also may lead to nonuniform panel display brightness, and a hysteresis effect of the drive transistor may cause short-term image sticking, thereby having a negative effect on the panel display quality.

SUMMARY

Embodiments of the present disclosure relates to a pixel circuit, a method for driving the pixel circuit, an array substrate, and a display device.

An embodiment according to a first aspect of the present disclosure provides a pixel circuit, which includes: a reset sub-circuit, a drive control sub-circuit, a power supply sub-circuit, a storage sub-circuit, a drive sub-circuit, and a light-emitting element. The reset sub-circuit is respectively coupled to a first scanning terminal, a reset terminal, a second scanning terminal, a reference power source terminal, a first control point and a second control point, and is configured to write an input voltage of the reset terminal into the first control point based on a scanning signal of the first scanning terminal and write an input voltage of the reference power source terminal into the second control point based on a scanning signal of the second scanning terminal. The drive control sub-circuit is respectively coupled to a third scanning terminal, a data terminal and the first control point, and is configured to write an input voltage of the data terminal into the first control point based on a scanning signal of the third scanning terminal, wherein the input voltage of the data terminal is greater than a differential between the input voltage of the reset terminal and a threshold voltage of the drive sub-circuit. The power supply sub-circuit is respectively coupled to a first power source terminal, the second scanning terminal, the second control point, a third control point and a fourth control point, and is configured to supply a voltage of the first power source terminal to the second control point based on the scanning signal of the second scanning terminal and enable the third control point to communicate with the fourth control point. The storage sub-circuit is respectively coupled to the first control point and the second control point, and is configured to store a voltage of the first control point and a voltage of the second control point. The drive sub-circuit is respectively coupled to the first control point, the second control point and the third control point, and is configured to discharge electricity under the control of the voltage of the first control point and the voltage of the second control point. The light-emitting element is respectively coupled to the fourth control point and a second power source terminal, and is configured to emit light under the control of a voltage of the fourth control point.

According to an embodiment of the present disclosure, the reset sub-circuit includes: a first transistor, wherein a control electrode of the first transistor is coupled to the first scanning terminal, a first electrode of the first transistor is coupled to the reset terminal, and a second electrode of the first transistor is coupled to the first control point; and a second transistor, wherein a control electrode of the second transistor is coupled to the second scanning terminal, a first electrode of the second transistor is coupled to the reference power source terminal, and a second electrode of the second transistor is coupled to the second control point.

According to an embodiment of the present disclosure, the first transistor is a P-type transistor, whereas the second transistor is an N-type transistor.

According to an embodiment of the present disclosure, the drive control sub-circuit includes: a third transistor, wherein a control electrode of the third transistor is coupled to the third scanning terminal, and a first electrode of the third transistor is coupled to the data terminal; and a fourth transistor, wherein a first electrode of the fourth transistor is coupled to a second electrode of the third transistor, and a control electrode of the fourth transistor is coupled to a second electrode of the fourth transistor and then is coupled to the first control point.

According to an embodiment of the present disclosure, both the third transistor and the fourth transistor are P-type transistors.

According to an embodiment of the present disclosure, the power supply sub-circuit includes: a fifth transistor, wherein a control electrode of the fifth transistor is coupled to the second scanning terminal, a first electrode of the fifth transistor is coupled to the first power source terminal, and a second electrode of the fifth transistor is coupled to the second control point; and a sixth transistor, wherein a control electrode of the sixth transistor is coupled to the second scanning terminal, a first electrode of the sixth transistor is coupled to the third control point, and a second electrode of the sixth transistor is coupled to the fourth control point.

According to an embodiment of the present disclosure, both the fifth transistor and the sixth transistor are P-type transistors.

According to an embodiment of the present disclosure, the drive sub-circuit includes a drive transistor. A control electrode of the drive transistor is coupled to the first control point, a first electrode of the drive transistor is coupled to the second control point, and a second electrode of the drive transistor is coupled to the third control point. The threshold voltage of the drive sub-circuit is a threshold voltage of the drive transistor.

According to an embodiment of the present disclosure, the drive transistor is a P-type transistor.

According to an embodiment of the present disclosure, the storage sub-circuit includes an energy storage capacitor, wherein one end of the energy storage capacitor is coupled to the first control point, and the other end of the energy storage capacitor is coupled to the second control point.

According to an embodiment of the present disclosure, the light-emitting element includes an organic light-emitting diode, wherein one end of the organic light-emitting diode is coupled to the fourth control point, and the other end of the organic light-emitting diode is coupled to the second power source terminal.

An embodiment according to a second aspect of the present disclosure provides a method for driving a pixel circuit, which is used for driving the above pixel circuit. The pixel circuit includes: a reset sub-circuit, a drive control sub-circuit, a power supply sub-circuit, a storage sub-circuit, a drive sub-circuit, and a light-emitting element. The method for driving the pixel circuit includes: inputting an ON scanning signal to a first scanning terminal and a second scanning terminal, inputting a reset voltage to a reset terminal, and inputting a first voltage to a reference power source terminal, such that the reset voltage is written into the first control point and the first voltage is written into the second control point; inputting an OFF scanning signal to the first scanning terminal, inputting an ON scanning signal to a third scanning terminal, inputting a data voltage to a data terminal, and inputting a reference voltage to the reference power source terminal, such that the data voltage is written into the first control point and the reference voltage is written into the second control point, wherein the data voltage of the data terminal is greater than a differential between the reset voltage of the reset terminal and the threshold voltage of the drive sub-circuit; and inputting an OFF scanning signal to the third scanning terminal, inputting an ON scanning signal to the second scanning terminal, and inputting a second voltage to the first power source terminal, such that the second voltage is written into the first control point, the third control point is communicated with the fourth control point, the drive sub-circuit discharges electricity via the light-emitting element under the control of the voltage of the first control point and the voltage of the second control point, and the light-emitting element is driven by electric current of the drive sub-circuit to emit light.

According to an embodiment of the present disclosure, the first voltage is not equal to the reference voltage.

According to an embodiment of the present disclosure, the reset sub-circuit includes a first transistor and a second transistor. The drive control sub-circuit includes a third transistor and a fourth transistor. The power supply sub-circuit includes a fifth transistor and a sixth transistor. The storage sub-circuit includes an energy storage capacitor, the drive sub-circuit includes a drive transistor, and the light-emitting element includes an organic light-emitting diode. When the ON scanning signal is inputted to the first scanning terminal and the second scanning terminal, both the first transistor and the second transistor are turned on. When the OFF scanning signal is inputted to the first scanning terminal and the ON scanning signal is inputted to the third scanning terminal, the second transistor, the third transistor and the fourth transistor are turned on. When the OFF scanning signal is inputted to the third scanning terminal and the ON scanning signal is inputted to the second scanning terminal, the fifth transistor, the sixth transistor and the drive transistor are turned on.

According to an embodiment of the present disclosure, the first transistor, the third transistor, the fourth transistor, the fifth transistor, the sixth transistor and the drive transistor are P-type transistors, whereas the second transistor is an N-type transistor.

According to an embodiment of the present disclosure, a timing sequence of the scanning signal includes: a reset phase, wherein a low level is inputted to the first scanning terminal, a high level is inputted to the second scanning terminal and the third scanning terminal, the reset voltage is inputted to the reset terminal, and the first voltage is inputted to the reference power source terminal in the reset phase; a data-writing phase, wherein a high level is inputted to the first scanning terminal and the second scanning terminal, a low level is inputted to the third scanning terminal, the data voltage is inputted to the data terminal, and the reference voltage is inputted to the reference power source terminal in the data-writing phase; and a light emission phase, wherein a high level is inputted to the first scanning terminal and the third scanning terminal, a low level is inputted to the second scanning terminal, and the second voltage is inputted to the first power source terminal in the light emission phase.

An embodiment according to a third aspect of the present disclosure provides an array substrate, which includes the above pixel circuit.

An embodiment according to a fourth aspect of the present disclosure provides a display device, which includes the above array substrate.

DETAILED DESCRIPTION

The embodiments of the present disclosure are described in detail as below. Examples of the embodiments are as shown in drawings, in which same or similar reference numbers always represent same or similar elements or elements with same or similar functions. The embodiments described with reference to the drawings are exemplary, just intended to explain the present disclosure, not interpreted as limiting the present disclosure.

The pixel circuit, the method for driving the pixel circuit, the array substrate and the display device provided according to the embodiments of the present disclosure are described below with reference to the drawings.

Figure 1:
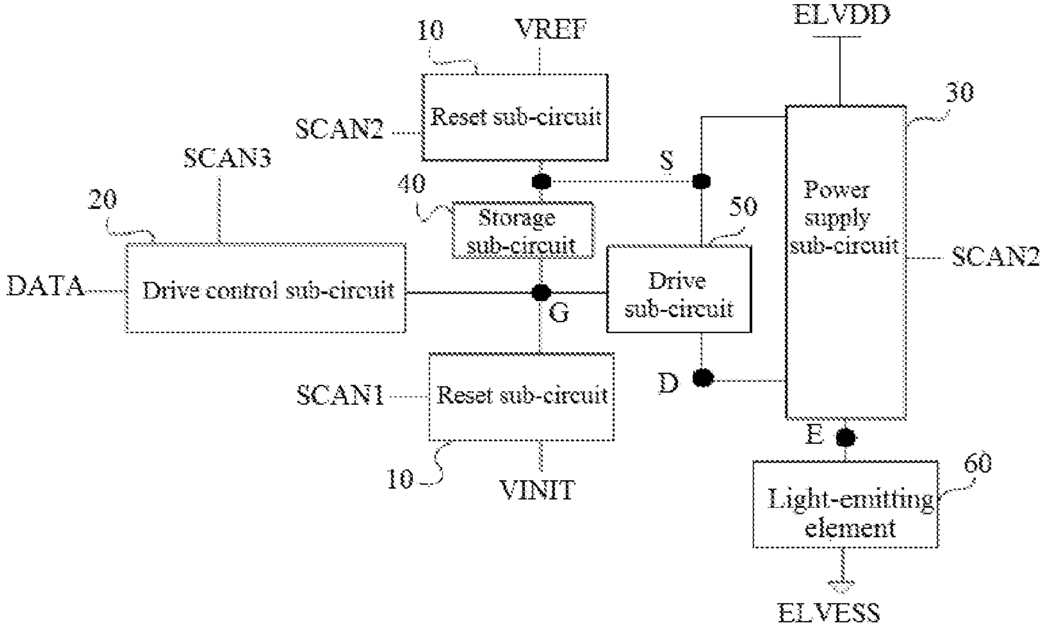
FIG. 1 is a schematic block diagram of a pixel circuit according to an embodiment of the present disclosure.

FIG. 1 is a schematic block diagram of the pixel circuit according to an embodiment of the present disclosure. As shown in FIG. 1, the pixel circuit includes a reset sub-circuit 10, a drive control sub-circuit 20, a power supply sub-circuit 30, a storage sub-circuit 40, a drive sub-circuit 50, and a light-emitting element 60.

The reset sub-circuit 10 is respectively coupled to a first scanning terminal SCAN1, a reset terminal VINIT, a second scanning terminal SCAN2, a reference power source terminal VREF, a first control point G and a second control point S, and is configured to write an input voltage of the reset terminal VINIT into the first control point G based on a scanning signal of the first scanning terminal SCAN1 and write an input voltage of the reference power source terminal VREF into the second control point S based on a scanning signal of the second scanning terminal SCAN2.

The drive control sub-circuit 20 is respectively coupled to a third scanning terminal SCAN3, a data terminal DATA and the first control point and is configured to write an input voltage of the data terminal DATA into the first control point G based on a scanning signal of the third scanning terminal SCAN3, wherein the input voltage of the data terminal DATA is greater than a differential between the input voltage of the reset terminal VINIT and a threshold voltage of the drive sub-circuit 50.

The power supply sub-circuit 30 is respectively coupled to a first power source terminal ELVDD, the second scanning terminal SCAN2, the second control point S, a third control point D and a fourth control point E, and is configured to supply a voltage of the first power source terminal ELVDD to the second control point S based on the scanning signal of the second scanning terminal SCAN2 and enable the third control point D to communicate with the fourth control point E.

The storage sub-circuit 40 is respectively coupled to the first control point G and the second control point S, and is configured to store a voltage of the first control point G and a voltage of the second control point S.

The drive sub-circuit 50 is respectively coupled to the first control point the second control point S and the third control point D, and is configured to discharge electricity under the control of the voltage of the first control point G and the voltage of the second control point S.

The light-emitting element 60 is respectively coupled to the fourth control point E and a second power source terminal ELVSS, and is configured to emit light under the control of a voltage of the fourth control point E.

In this pixel circuit, the reset sub-circuit 10 resets the voltage of the first control point G and the voltage of the second control point S within each frame of display time, such that the drive sub-circuit 50 is in a fixed voltage biasing state (i.e., an On-Bias state) under the combined action of the voltage of the first control point G and the voltage of the second control point S. In this way, no matter the voltage of the data terminal DATA is a high voltage or a low voltage within the previous frame of display time, that is, no matter a picture is white or black within the previous frame of display time, the drive sub-circuit 50 starts the next state from the fixed voltage biasing state, and thus the short-term image sticking resulted from a hysteresis effect may be effectively improved.

Moreover, within each frame of display time, the drive control sub-circuit 20 also writes an input voltage of the data terminal DATA into the first control point and the input voltage of the data terminal DATA is greater than a differential between the input voltage of the reset terminal VINIT and a threshold voltage of the drive sub-circuit 50, such that the voltage of the first control point G includes the threshold voltage of the drive sub-circuit 50, and the power supply sub-circuit 30 writes a voltage of the first power source terminal ELVDD into the second control point S, such that both the voltage of the first control point G and the voltage of the second control point S include the voltage of the first power source terminal ELVDD under the action of the storage sub-circuit 40. In this way, when the drive sub-circuit 50 discharges electricity, the threshold voltage of the first control point G cancels out the threshold voltage of the drive sub-circuit 50, and the voltage of the first power source terminal ELVDD in the first control point G cancels out the voltage of the second control point S, such that the discharge current of the drive sub-circuit 50 includes neither the threshold voltage of the drive sub-circuit 50 nor the voltage of the first power source terminal ELVDD, and magnitude of current of the light-emitting element 60 is not affected by the threshold voltage and IR drop, thereby effectively increasing uniformity of the pixel current, solving the problem of nonuniform panel display brightness, and greatly improving the display quality.

Thus, the pixel circuit according to the embodiment of the present disclosure not only may effectively improve short-term image sticking resulted from the hysteresis effect, but also may ensure that the finally obtained pixel current includes neither the threshold voltage nor the voltage of the first power source terminal, thereby implementing threshold voltage compensation and IR drop compensation, effectively increasing uniformity of the pixel current, and solving the problem of nonuniform panel display brightness.

Figure 2:
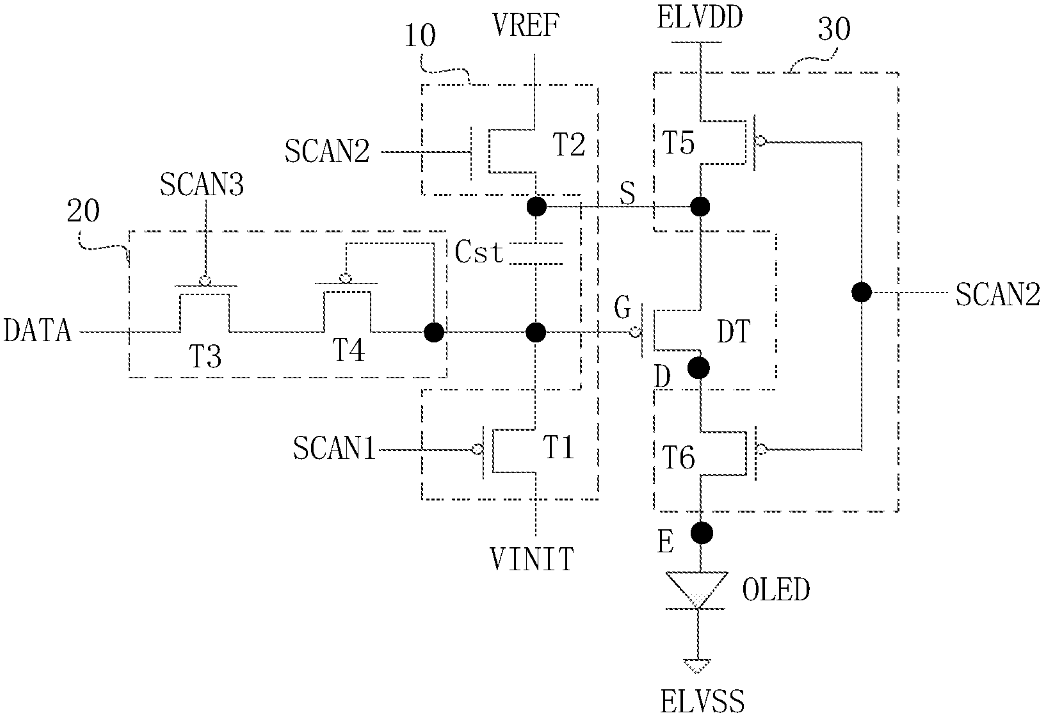
FIG. 2 is a schematic structural diagram of a pixel circuit according to an embodiment of the present disclosure.

Further, according to an embodiment of the present disclosure, as shown in FIG. 2, the reset sub-circuit 10 includes a first transistor T1 and a second transistor T2. A control electrode of the first transistor T1 is coupled to the first scanning terminal SCAN1, a first electrode of the first transistor T1 is coupled to the reset terminal VINIT, and a second electrode of the first transistor T1 is coupled to the first control point G A control electrode of the second transistor T2 is coupled to the second scanning terminal SCAN2, a first electrode of the second transistor T2 is coupled to the reference power source terminal VREF, and a second electrode of the second transistor T2 is coupled to the second control point S. The first transistor T1 writes an input voltage of the reset terminal VINIT into the first control point G based on a scanning signal of the first scanning terminal SCAN1, and the second transistor T2 writes an input voltage of the reference power source terminal VREF into the second control point S based on a scanning signal of the second scanning terminal SCAN2.

Specifically, as shown in FIG. 2, within each frame of display time, the ON scanning signal is inputted via the first scanning terminal SCAN1 to turn on the first transistor T1, and in the meanwhile the ON scanning signal is inputted via the second scanning terminal SCAN2 to turn on the second transistor T2, such that the input voltage (such as the reset voltage Vinit) provided by the current reset terminal VINIT is written into the first control point and the input voltage (such as the first voltage) provided by the current reference power source terminal VREF is written into the second control point S. The drive sub-circuit 50 is in a fixed voltage biasing state under the combined action of the first control point G and the second control point S, such that no matter a picture is white or black within the previous frame of display time, the drive sub-circuit 50 starts the next state from the fixed voltage biasing state, and thus the short-term image sticking resulted from the hysteresis effect may be effectively improved.

The drive control sub-circuit 20 includes a third transistor T3 and a fourth transistor T4. A control electrode of the third transistor T3 is coupled to the third scanning terminal SCAN3, and a first electrode of the third transistor T3 is coupled to the data terminal DATA. A first electrode of the fourth transistor T4 is coupled to a second electrode of the third transistor T3, and a control electrode of the fourth transistor T4 is coupled to a second electrode of the fourth transistor T4 and then is coupled to the first control point G. The third transistor T3 and the fourth transistor T4 write an input voltage of the data terminal DATA into the first control point G based on a scanning signal of the third scanning terminal SCAN3, wherein the input voltage of the data terminal DATA is greater than a differential between the input voltage of the reset terminal VINIT and a threshold voltage of the drive sub-circuit 50.

Specifically, as shown in FIG. 2, within each frame of display time, the ON scanning signal is inputted via the third scanning terminal SCAN3 to turn on the third transistor T3, and under the condition that the fourth transistor T4 is turned on, the input voltage (such as the data voltage Vdata for display) of the current data terminal DATA is written into the first control point that is, the drive sub-circuit 50 is charged. The condition of turning on the fourth transistor T4 is that the data voltage Vdata of the data terminal DATA is greater than a differential between the reset voltage Vinit of the reset terminal VINIT and a threshold voltage Vth of the drive sub-circuit 50, i.e., $Vinit-Vth<Vdata$. When the drive sub-circuit 50 is charged and the voltage of the drive sub-circuit 50 reaches $Vdata+Vth$, that is, when Vinit or the voltage of the first control point G is $Vdata+Vth$, the fourth transistor T4 is turned off, and thus charging the drive sub-circuit 50 is stopped. At this moment, the voltage of the first control point G is $Vdata+Vth$, including the threshold voltage of the drive sub-circuit 50. That is, when the data voltage Vdata for display is written into the drive sub-circuit 50, the threshold voltage of the drive sub-circuit 50 is also indirectly written to compensate the threshold voltage of the drive sub-circuit 50. In this way, the problem of nonuniform display brightness caused by drift of threshold voltage is effectively solved.

The power supply sub-circuit 30 includes a fifth transistor T5 and a sixth transistor T6. A control electrode of the fifth transistor T5 is coupled to the second scanning terminal SCAN2, a first electrode of the fifth transistor T5 is coupled to the first power source terminal ELVDD, and a second electrode of the fifth transistor T5 is coupled to the second control point S. A control electrode of the sixth transistor T6 is coupled to the second scanning terminal SCAN2, a first electrode of the sixth transistor T6 is coupled to the third control point D, and a second electrode of the sixth transistor T6 is coupled to the fourth control point E. The fifth transistor T5 writes a voltage of the first power source terminal ELVDD into the second control point S based on a scanning signal of the second scanning terminal SCAN2, and the sixth transistor T6 communicates the third control point D with the fourth control point E based on the scanning signal of the second scanning terminal SCAN2.

Specifically, as shown in FIG. 2, within each frame of display time, the ON scanning signal is inputted via the second scanning terminal SCAN2 to turn on the fifth transistor T5 and the sixth transistor T6, such that a voltage (such as the second voltage) of the first power source terminal ELVDD is written into the second control point S, and the third control point D is communicated with the fourth control point E. Under the coupling effect of the storage sub-circuit 40, the voltage of the first power source terminal ELVDD is coupled to the first control point G. Under the action of the first control point G and the second control point S, the drive sub-circuit 50 discharges electricity, and the discharge current is unrelated to the threshold voltage of the drive sub-circuit 50 and the voltage of the first power source terminal ELVDD. In this way, threshold voltage compensation and IR drop compensation are implemented, uniformity of pixel current is effectively increased, and the problem of nonuniform panel display brightness is solved.

The drive sub-circuit 50 includes a drive transistor DT. A control electrode of the drive transistor DT is coupled to the first control point G; a first electrode of the drive transistor DT is coupled to the second control point S, and a second electrode of the drive transistor DT is coupled to the third control point D, wherein the threshold voltage of the drive sub-circuit 50 is a threshold voltage of the drive transistor DT. The drive transistor DT discharges electricity under the control of the first control point G and the second control point S.

The storage sub-circuit 40 includes an energy storage capacitor Cst. One end of the energy storage capacitor Cst is coupled to the first control point and the other end of the energy storage capacitor Cst is coupled to the second control point S. The voltage of the first control point G and the voltage of the second control point S are stored via the energy storage capacitor Cst.

The light-emitting element 60 includes an organic light-emitting diode OLED, wherein one end of the organic light-emitting diode OLED is coupled to the fourth control point E, and the other end of the organic light-emitting diode OLED is coupled to the second power source terminal ELVSS. Driven by the drive transistor DT, the organic light-emitting diode OLED emits light.

Further, in the pixel circuit as shown in FIG. 2, the first transistor T1, the third transistor T3, the fourth transistor T4, the fifth transistor T5, the sixth transistor T6 and the drive transistor DT are P-type transistors, whereas the second transistor T2 is an N-type transistor. The P-type transistor is turned on when its gate is at a low level and is turned off when its gate is at a high level. The N-type transistor is turned on when its gate is at a high level and is turned off when its gate is at a low level.

Figure 3A:
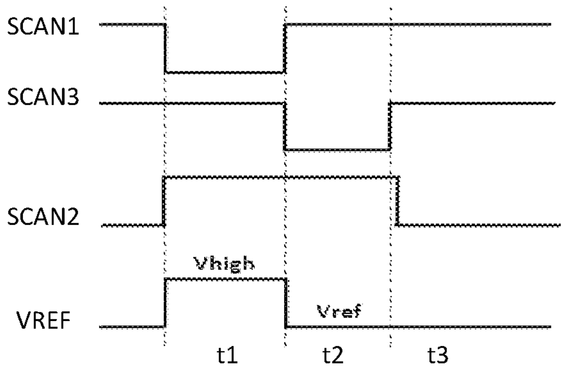
FIG. 3*a* is a working control timing diagram of a pixel circuit according to an embodiment of the present disclosure.
Figure 3B:
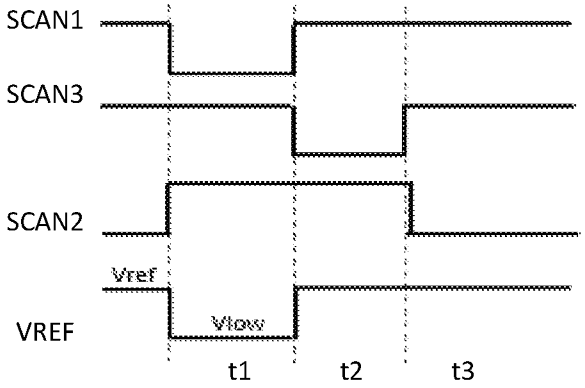
FIG. 3*b* is a working control timing diagram of a pixel circuit according to another embodiment of the present disclosure.

When the first transistor T1, the third transistor T3, the fourth transistor T4, the fifth transistor T5, the sixth transistor T6 and the drive transistor DT are the P-type transistors whereas the second transistor T2 is the N-type transistor, as shown in FIG. 3*a* or FIG. 3*b*, a working process of the pixel circuit may include three phases as below.

Figure 4A:
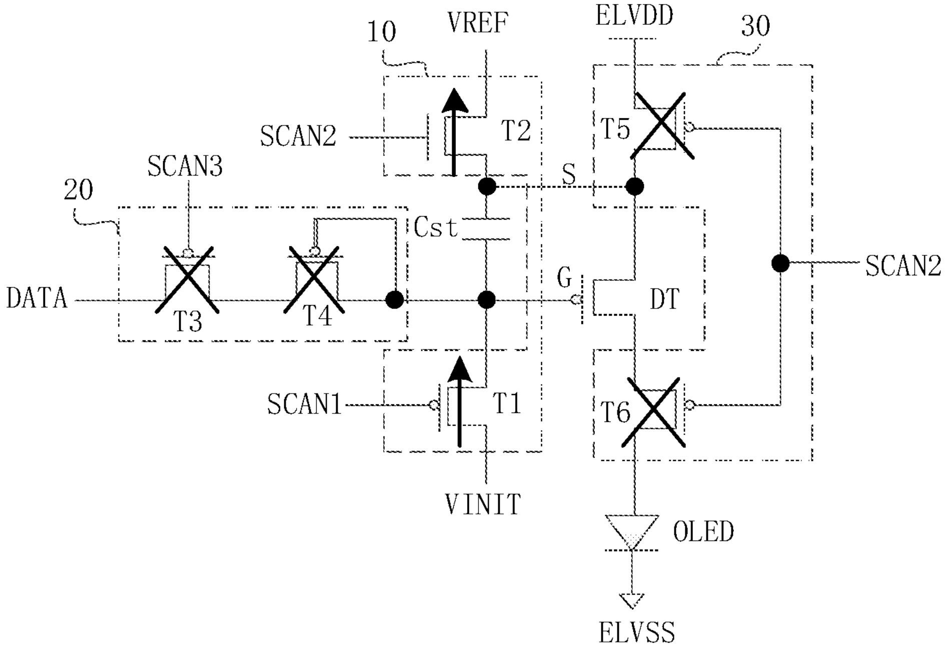
FIG. 4*a* is a schematic diagram showing a pixel circuit in a reset phase according to an embodiment of the present disclosure.

In a reset phase t1, a low level is inputted to the first scanning terminal SCAN1, a high level is inputted to the second scanning terminal SCAN2 and the third scanning terminal SCAN3. As shown in FIG. 4*a*, both the first transistor T1 and the second transistor T2 are turned on, and in the meanwhile the reset voltage Vinit is inputted to the reset terminal VINIT, and the first voltage (for example, Vhigh or Vlow) is inputted to the reference power source terminal VREF. At this moment, the first control point G is reset as Vinit, and the second control point S is reset as the first voltage (for example, Vhigh or Vlow). The drive transistor DT is in a fixed voltage biasing state under the combined action of the reset voltage Vinit and the first voltage (for example, Vhigh or Vlow), such that no matter a picture is white or black within the previous frame of display time, the drive transistor DT starts the next state from the fixed voltage biasing state, and thus the short-term image sticking resulted from the hysteresis effect may be effectively improved.

Figure 4B:
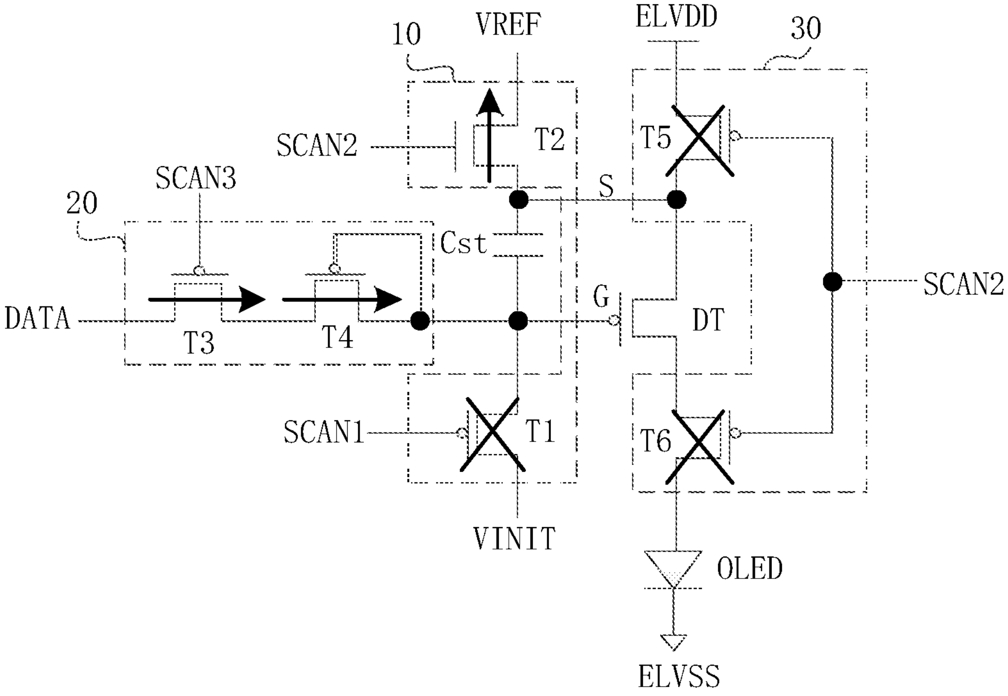
FIG. 4*b* is a schematic diagram showing a pixel circuit in a data-writing phase according to an embodiment of the present disclosure.

In a data-writing phase t2, a high level is inputted to the first scanning terminal SCAN1 and the second scanning terminal SCAN2, and a low level is inputted to the third scanning terminal SCAN3. As shown in FIG. 4*b*, both the second transistor T2 and the third transistor T3 are turned on, and in the meanwhile the data voltage Vdata is inputted to the data terminal DATA, and the reference voltage Vref is inputted to the reference power source terminal VREF, wherein the data voltage Vdata inputted to the data terminal DATA is greater than a differential between the reset voltage Vinit inputted to the reset terminal VINIT and a threshold voltage Vth of the drive transistor DT, such that the fourth transistor T4 is turned on. At this moment, the data voltage Vdata for display of the data terminal DATA is written into the first control point i.e., the drive transistor DT is charged. When the voltage of the drive transistor DT reaches Vdata+Vth, i.e., when Vinit or the voltage of the first control point G is Vdata+Vth, the fourth transistor T4 is turned off, and thus charging the drive transistor DT is stopped. At this moment, the voltage of the first control point G is Vdata+Vth, and in the meanwhile reference voltage Vref of the reference power source terminal VREF is written into the second control point S, i.e., the voltage of the second control point S is Vref.

Figure 4C:
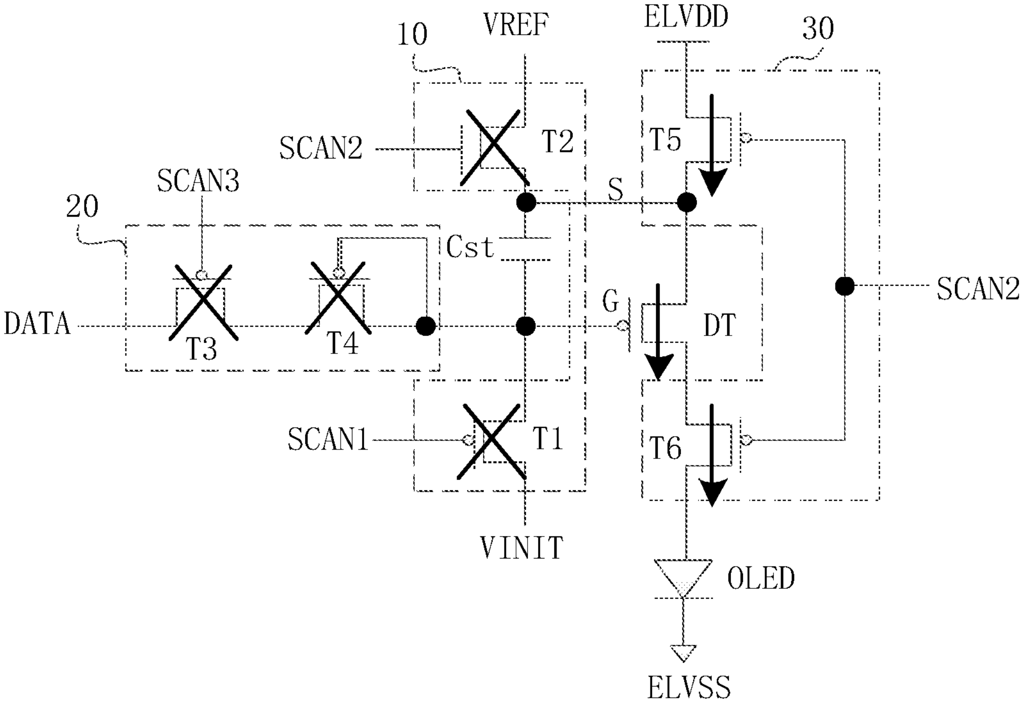
FIG. 4*c* is a schematic diagram showing a pixel circuit in a light emission phase according to an embodiment of the present disclosure.

In a light emission phase t3, a high level is inputted to the first scanning terminal SCAN1 and the third scanning terminal SCAN3, and a low level is inputted to the second scanning terminal SCAN2. As shown in FIG. 4*c*, both the fifth transistor T5 and the sixth transistor T6 are turned on, and a second voltage VDD is inputted to the first power source terminal ELVDD. At this moment, the voltage VDD of the first power source terminal ELVDD is inputted to the second control point S, i.e., the voltage of the second control point S is VDD, and in the meanwhile the voltage of the first control point G is Vdata+Vth+VDD-Vref under the action of the storage sub-circuit. Under the combined action of the first control point G and the second control point S, the drive transistor DT is turned on to drive the organic light-emitting diode OLED to emit light. At this moment, electric current flowing through the organic light-emitting diode OLED $Ioled=0.5\ \mu nCox(W/L)(Vgs-Vth)^2=0.5\ \mu nCox(W/L)(Vdata+Vth+VDD-Vref-VDD-Vth)^2=0.5\ \mu nCox\ (W/L)(Vdata-Vref)^2$. As can be seen from the above formula, the electric current finally flowing through the organic light-emitting diode OLED is unrelated to the threshold voltage of the drive transistor and the voltage provided by the first power source terminal. In this way, threshold voltage compensation and IR drop compensation are implemented, uniformity of pixel current is effectively increased, and the problem of nonuniform panel display brightness is solved.

It is to be noted that in the present disclosure, the first voltage inputted to the reset reference terminal VREF is not equal to the reference voltage Vref. For example, the first voltage may be Vlow lower than the reference voltage Vref or may be Vhigh higher than the reference voltage Vref. Actually, the first voltage also may be equal to the reference voltage Vref. However, when the first voltage is equal to the reference voltage Vref, it is found through a test that there is no obvious effect on solving the problem of short-term image sticking at this moment. Therefore, generally there exists a certain voltage differential between the first voltage and the reference voltage, which may be specifically obtained through an experimental test. Moreover, in the embodiment of the present disclosure, other types of transistors also may be employed, which are not specifically limited herein.

In conclusion, in the pixel circuit according to the embodiment of the present disclosure, the reset sub-circuit resets the voltage of the first control point and the voltage of the second control point, such that a drive sub-circuit is in a fixed voltage biasing state, and thus the short-term image sticking resulted from the hysteresis effect may be effectively improved. In the meanwhile, the drive control sub-circuit also writes a threshold voltage of the drive sub-circuit into the first control point, and the power supply sub-circuit also supplies the voltage of the first power source terminal to the second control point, such that the finally obtained pixel current includes neither the threshold voltage nor the voltage of the first power source terminal under the action of the storage sub-circuit, thereby implementing threshold voltage compensation and IR drop compensation, effectively increasing uniformity of the pixel current, and solving the problem of nonuniform panel display brightness.

Figure 5:
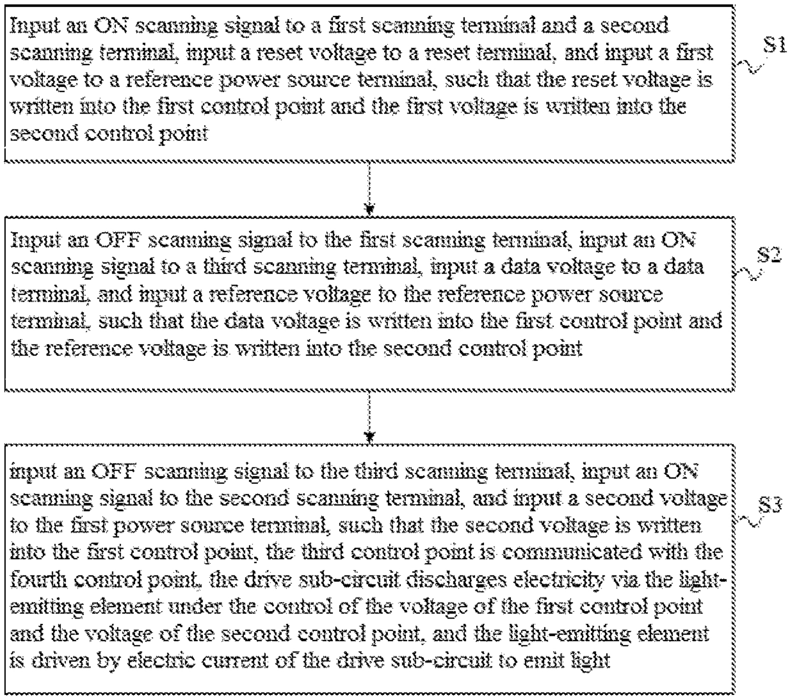
FIG. 5 is a flowchart of a method for driving a pixel circuit according to an embodiment of the present disclosure.

FIG. 5 is a flowchart of a method for driving a pixel circuit according to an embodiment of the present disclosure. The method for driving a pixel circuit may be applied to the pixel circuit as shown in FIG. 1 and FIG. 2. The pixel circuit may include a reset sub-circuit 10, a drive control sub-circuit 20, a power supply sub-circuit 30, a storage sub-circuit 40, a drive sub-circuit 50, and a light-emitting element 60. The method for driving a pixel circuit may include following steps:

Step S1: inputting an ON scanning signal to a first scanning terminal and a second scanning terminal, inputting a reset voltage to a reset terminal, and inputting a first voltage to a reference power source terminal, such that the reset voltage is written into the first control point and the first voltage is written into the second control point;

Step S2: inputting an OFF scanning signal to the first scanning terminal, inputting an ON scanning signal to a third scanning terminal, inputting a data voltage to a data terminal, and inputting a reference voltage to the reference power source terminal, such that the data voltage is written into the first control point and the reference voltage is written into the second control point, wherein the data voltage of the data terminal is greater than a differential between the reset voltage of the reset terminal and the threshold voltage of the drive sub-circuit; and Step S3: inputting an OFF scanning signal to the third scanning terminal, inputting an ON scanning signal to the second scanning terminal, and inputting a second voltage to the first power source terminal, such that the second voltage is written into the first control point, the third control point is communicated with the fourth control point, the drive sub-circuit discharges electricity via the light-emitting element under the control of the voltage of the first control point and the voltage of the second control point, and driven by electric current of the drive sub-circuit, the light-emitting element emits light.

Herein, the ON scanning signal may be signal that enables an element to be turned on. As for a transistor, the ON scanning signal may be signal that enables the transistor to be turned on. For example, when the transistor is N type transistor, the ON scanning signal may be high level signal; and when the transistor is P type transistor, the ON scanning signal may be low level signal. The OFF scanning signal may be signal that enables the element to be turned off. As for the transistor, the ON scanning signal may be signal that enables the transistor to be turned on. For example, when the transistor is N type transistor, the OFF scanning signal may be low level signal; and when the transistor is P type transistor, the OFF scanning signal may be high level signal.

Specifically, the pixel circuit as shown in FIG. 1 is taken as an example. Within each frame of display time, an ON scanning signal is inputted to the first scanning terminal SCAN1 and the second scanning terminal SCAN2, a reset voltage Vinit is inputted to a reset terminal VINIT, and a first voltage (such as Vhigh or Vlow) is inputted to the reference power source terminal VREF, such that the reset voltage Vinit is written into the first control point G and the first voltage (such as Vhigh or Vlow) is written into the second control point S, i.e., the reset sub-circuit 10 resets the voltage of the first control point G and the voltage of the second control point S. The drive sub-circuit 50 is in a fixed voltage biasing state under the combined action of the voltage of the first control point G and the voltage of the second control point S, such that no matter the voltage of the data terminal DATA is a high voltage or a low voltage within the previous frame of display time, i.e., no matter a picture is white or black within the previous frame of display time, the drive sub-circuit 50 starts the next state from the fixed voltage biasing state, and thus the short-term image sticking resulted from the hysteresis effect may be effectively improved.

Further, within each frame of display time, an OFF scanning signal is inputted to the first scanning terminal SACN1, an ON scanning signal is inputted to a third scanning terminal SACN3, a data voltage Vdata is inputted to a data terminal DATA, and a reference voltage Vref is inputted to the reference power source terminal VREF, wherein the data voltage Vdata inputted to the data terminal DATA is greater than a differential between the reset voltage Vinit inputted to the reset terminal VINIT and the threshold voltage Vth of the drive sub-circuit 50, such that the data voltage Vdata is written into the first control point G and the reference voltage Vref is written into the second control point S. Furthermore, the voltage of the first control point G also includes the threshold voltage Vth of the drive sub-circuit 50. That is, when the data voltage Vdata of the data terminal DATA is written into the first control point G via the drive control sub-circuit 20, the threshold voltage of the drive sub-circuit 50 is also indirectly written to compensate the threshold voltage of the drive sub-circuit 50, and the reference voltage Vref inputted to the reference power source terminal VREF is also written to the second control point S via the reset sub-circuit 10 to provide a fixed reference voltage for the light-emitting element 60.

More further, an OFF scanning signal is inputted to the third scanning terminal SCAN3, an ON scanning signal is inputted to the second scanning terminal SCAN2, and a second voltage is inputted to the first power source terminal ELVDD, such that the second voltage is written into the first control point and the third control point D is communicated with the fourth control point E. That is, the voltage of the first power source terminal ELVDD is written into the second control point S via the power supply sub-circuit 30. Under the action of the storage sub-circuit 40, both the voltage of the first control point G and the voltage of the second control point S include the voltage of the first power source terminal ELVDD. In this way, when the drive sub-circuit 50 discharges electricity, the threshold voltage of the first control point G cancels out the threshold voltage of the drive sub-circuit 50, and the voltage of the first power source terminal ELVDD in the first control point G cancels out the voltage of the second control point S, such that the discharge current of the drive sub-circuit 50 includes neither the threshold voltage of the drive sub-circuit 50 nor the voltage of the first power source terminal ELVDD, and magnitude of current of the light-emitting element 60 is not affected by the threshold voltage and IR drop, thereby effectively increasing uniformity of the pixel current, solving the problem of nonuniform panel display brightness, and greatly improving the display quality.

It is to be noted that in the present disclosure, the first voltage inputted to the reset reference terminal VREF is not equal to the reference voltage Vref. For example, the first voltage may be Vlow lower than the reference voltage Vref or may be Vhigh higher than the reference voltage Vref. Actually, the first voltage also may be equal to the reference voltage Vref. However, when the first voltage is equal to the reference voltage Vref, it is found through a test that there is no obvious effect on solving the problem of short-term image sticking at this moment. Therefore, generally there exists a certain voltage differential between the first voltage and the reference voltage, which may be specifically obtained through an experimental test.

Thus, the method for driving a pixel circuit according to the embodiment of the present disclosure not only can effectively improve short-term image sticking resulted from the hysteresis effect, but also may ensure that the finally obtained pixel current includes neither the threshold voltage nor the voltage of the first power source terminal, thereby implementing threshold voltage compensation and IR drop compensation, effectively increasing uniformity of the pixel current, and solving the problem of nonuniform panel display brightness.

Further, according to an embodiment of the present disclosure, the reset sub-circuit includes a first transistor and a second transistor. The drive control sub-circuit includes a third transistor and a fourth transistor. The power supply sub-circuit includes a fifth transistor and a sixth transistor. The storage sub-circuit includes an energy storage capacitor, the drive sub-circuit includes a drive transistor, and the light-emitting element includes an organic light-emitting diode. When the ON scanning signal is inputted to the first scanning terminal and the second scanning terminal, both the first transistor and the second transistor are turned on. When the OFF scanning signal is inputted to the first scanning terminal and the ON scanning signal is inputted to the third scanning terminal, the second transistor, the third transistor and the fourth transistor are turned on. When the OFF scanning signal is inputted to the third scanning terminal and the ON scanning signal is inputted to the second scanning terminal, the fifth transistor, the sixth transistor and the drive transistor are turned on.

The first transistor, the third transistor, the fourth transistor, the fifth transistor, the sixth transistor and the drive transistor are P-type transistors, whereas the second transistor is an N-type transistor.

Further, according to an embodiment of the present disclosure, a timing sequence of the scanning signal includes: a reset phase, wherein a low level is inputted to the first scanning terminal, a high level is inputted to the second scanning terminal and the third scanning terminal, the reset voltage is inputted to the reset terminal, and the first voltage is inputted to the reference power source terminal in the reset phase; a data-writing phase, wherein a high level is inputted to the first scanning terminal and the second scanning terminal, a low level is inputted to the third scanning terminal, the data voltage is inputted to the data terminal, and the reference voltage is inputted to the reference power source terminal in the data-writing phase; and a light emission phase, wherein a high level is inputted to the first scanning terminal and the third scanning terminal, a low level is inputted to the second scanning terminal, and the second voltage is inputted to the first power source terminal in the light emission phase.

Specifically, the pixel circuit as shown in FIG. 2 is taken as an example. As shown in FIG. 3*a* or FIG. 3*b*, a working process of the pixel circuit may include three phases as below.

In a reset phase t1, a low level is inputted to the first scanning terminal SCAN1, a high level is inputted to the second scanning terminal SCAN2 and the third scanning terminal SCAN3. As shown in FIG. 4*a*, both the first transistor T1 and the second transistor T2 are turned on, and in the meanwhile the reset voltage Vinit is inputted to the reset terminal VINIT, and the first voltage (for example, Vhigh or Vlow) is inputted to the reference power source terminal VREF. At this moment, the first control point G is reset as Vinit, and the second control point S is reset as the first voltage (for example, Vhigh or Vlow). The drive transistor DT is in a fixed voltage biasing state under the combined action of the reset voltage Vinit and the first voltage (for example, Vhigh or Vlow), such that no matter a picture is white or black within the previous frame of display time, the drive transistor DT starts the next state from the fixed voltage biasing state, and thus the short-term image sticking resulted from the hysteresis effect may be effectively improved.

In a data-writing phase t2, a high level is inputted to the first scanning terminal SCAN1 and the second scanning terminal SCAN2, and a low level is inputted to the third scanning terminal SCAN3. As shown in FIG. 4*b*, both the second transistor T2 and the third transistor T3 are turned on, and in the meanwhile the data voltage Vdata is inputted to the data terminal DATA, and the reference voltage Vref is inputted to the reference power source terminal VREF, wherein the data voltage Vdata inputted to the data terminal DATA is greater than a differential between the reset voltage Vinit inputted to the reset terminal VINIT and a threshold voltage Vth of the drive transistor DT, such that the fourth transistor T4 is turned on. At this moment, the data voltage Vdata for display of the data terminal DATA is written into the first control point i.e., the drive transistor DT is charged. When the voltage of the drive transistor DT reaches Vdata+Vth, i.e., when Vinit or the voltage of the first control point G is Vdata+Vth, the fourth transistor T4 is turned off, and thus charging the drive transistor DT is stopped. At this moment, the voltage of the first control point G is Vdata+Vth, and in the meanwhile reference voltage Vref of the reference power source terminal VREF is written into the second control point S, i.e., the voltage of the second control point S is Vref.

In a light emission phase t3, a high level is inputted to the first scanning terminal SCAN1 and the third scanning terminal SCAN3, and a low level is inputted to the second scanning terminal SCAN2. As shown in FIG. 4*c*, both the fifth transistor T5 and the sixth transistor T6 are turned on, and a second voltage VDD is inputted to the first power source terminal ELVDD. At this moment, the voltage VDD of the first power source terminal ELVDD is inputted to the second control point S, i.e., the voltage of the second control point S is VDD, and in the meanwhile the voltage of the first control point G is Vdata+Vth+VDD−Vref under the action of the storage sub-circuit. Under the combined action of the first control point G and the second control point S, the drive transistor DT is turned on to drive the organic light-emitting diode OLED to emit light. At this moment, electric current flowing through the organic light-emitting diode OLED $Ioled=0.5\ \mu nCox(W/L)(Vgs-Vth)^2=0.5\ \mu nCox(W/L)(Vdata+Vth+VDD-Vref-VDD-Vth)^2=0.5\ \mu nCox(W/L)(Vdata-Vref)^2$. As can be seen from the above formula, the electric current finally flowing through the organic light-emitting diode OLED is unrelated to the threshold voltage of the drive transistor and the voltage provided by the first power source terminal. In this way, threshold voltage compensation and IR drop compensation are implemented, uniformity of pixel current is effectively increased, and the problem of nonuniform panel display brightness is solved.

In conclusion, according to the method for driving a pixel circuit provided by the embodiment of the present disclosure, the reset sub-circuit resets the voltage of the first control point and the voltage of the second control point, such that a drive sub-circuit is in a fixed voltage biasing state, and thus the short-term image sticking resulted from a hysteresis effect may be effectively improved. In the meanwhile, the drive control sub-circuit also writes a threshold voltage of the drive sub-circuit into the first control point, and the power supply sub-circuit also supplies the voltage of the first power source terminal to the second control point, such that the finally obtained pixel current includes neither the threshold voltage nor the voltage of the first power source terminal under the action of the storage sub-circuit, thereby implementing threshold voltage compensation and IR drop compensation, effectively increasing uniformity of the pixel current, and solving the problem of nonuniform panel display brightness.

Figure 6:
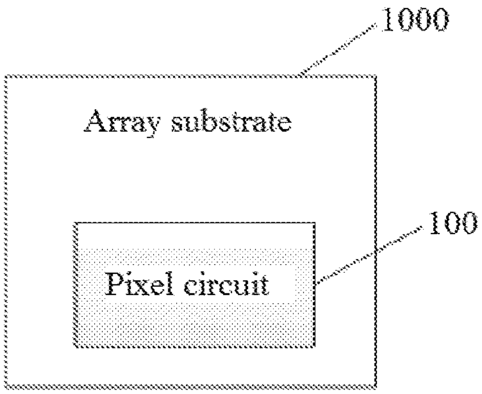
FIG. 6 is a schematic block diagram of an array substrate according to an embodiment of the present disclosure.

FIG. 6 is a schematic block diagram of an array substrate according to an embodiment of the present disclosure. As shown in FIG. 6, the array substrate 1000 may include the above pixel circuit 100.

According to the array substrate of the embodiment of the present disclosure, by means of the pixel circuit, short-term image sticking resulted from the hysteresis effect can be effectively improved, threshold voltage compensation and IR drop compensation may be implemented, uniformity of pixel current may be effectively increased, and the problem of nonuniform panel display brightness may be solved.

Figure 7:
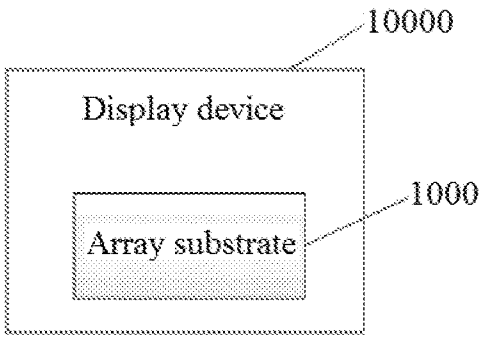
FIG. 7 is a schematic block diagram of a display device according to an embodiment of the present disclosure.

FIG. 7 is a schematic block diagram of a display device according to an embodiment of the present disclosure. As shown in FIG. 7, the display device 10000 includes the above array substrate 1000.

According to the display device of the embodiment of the present disclosure, by means of the above array substrate, short-term image sticking resulted from the hysteresis effect can be effectively improved, threshold voltage compensation and IR drop compensation may be implemented, uniformity of pixel current may be effectively increased, and the problem of nonuniform panel display brightness may be solved.

In the description of the present disclosure, it is to be understood that terms “first” and “second” are used only for purposes of description and are not intended to indicate or imply relative importance or to imply the number of indicated technical features. Thus, the feature defined with “first” and “second” may explicitly or implicitly include at least one such feature. In the description of the present disclosure, “a plurality of” refers to at least two, for example, two, three, etc., unless otherwise expressly specified.

In the present disclosure, it is to be noted that unless specified or limited otherwise, terms such as “installation”, “connecting”, “connection” or “fixation” should be understood in a broad sense, which may be, for example, a fixed connection, a detachable connection or integrated connection, a mechanical connection or an electrical connection, a direct connection or indirect connection by means of an intermediary, an internal communication between two components or an interaction relationship between two components. For those of ordinary skill in the art, specific meanings of the above terms in the present disclosure may be understood based on specific circumstances.

Reference throughout this specification to the terms “an embodiment,” “some embodiments,” “an example,” “a specific example,” or “some examples,” means that a specific feature, structure, material, or characteristic described in connection with the embodiment or example is included in at least one embodiment or example of the present disclosure. The schematic representation of the above terms throughout this specification is not necessarily referring to the same embodiment or example. Furthermore, the specific features, structures, materials, or characteristics may be combined in any suitable manner in one or more embodiments or examples. In addition, without contradiction, those skilled in the art may combine different embodiments or examples described in the specification and features of different embodiments or examples.

Although the embodiments of the present disclosure have been shown and described above, it is to be understood by those of ordinary skill in the art that the above embodiments are exemplary and shall not be construed as limiting the present disclosure, and any changes, modifications, replacements and variations may be made to the embodiments without departing from the scope of the present disclosure.

What is claimed is:

1. A pixel circuit, comprising a reset sub-circuit, a drive control sub-circuit, a power supply sub-circuit, a storage sub-circuit, a drive sub-circuit, and a light-emitting element, wherein the reset sub-circuit is respectively coupled to a first scanning terminal, a reset terminal, a second scanning terminal, a reference power source terminal, a first control point and a second control point, and is configured to write an input voltage of the reset terminal into the first control point based on a scanning signal of the first scanning terminal and to write an input voltage of the reference power source terminal into the second control point based on a scanning signal of the second scanning terminal;

the drive control sub-circuit is respectively coupled to a third scanning terminal, a data terminal and the first control point, and is configured to write an input voltage of the data terminal into the first control point based on a scanning signal of the third scanning terminal;

the power supply sub-circuit is respectively coupled to a first power source terminal, the second scanning terminal, the second control point, a third control point and a fourth control point, and is configured to supply a voltage of the first power source terminal to the second control point based on the scanning signal of the second scanning terminal and to enable the third control point to communicate with the fourth control point;

the storage sub-circuit is respectively coupled to the first control point and the second control point, and is configured to store a voltage of the first control point and a voltage of the second control point;

the drive sub-circuit is respectively coupled to the first control point, the second control point and the third control point, and is configured to discharge electricity under the control of the voltage of the first control point and the voltage of the second control point; and the light-emitting element is respectively coupled to the fourth control point and a second power source terminal, and is configured to emit light under the control of a voltage of the fourth control point, wherein the reset sub-circuit comprises, a first transistor, wherein a control electrode of the first transistor is coupled to the first scanning terminal, a first electrode of the first transistor is coupled to the reset terminal, and a second electrode of the first transistor is coupled to the first control point, and a second transistor, wherein a control electrode of the second transistor is coupled to the second scanning terminal, a first electrode of the second transistor is coupled to the reference power source terminal, and a second electrode of the second transistor is coupled to the second control point, wherein the drive sub-circuit comprises:

a third transistor, wherein a control electrode of the third transistor is coupled to the third scanning terminal, and a first electrode of the third transistor is coupled to the data terminal; and a fourth transistor, wherein a first electrode of the fourth transistor is coupled to a second electrode of the third transistor, and a control electrode of the fourth transistor is coupled to a second electrode of the fourth transistor and then is coupled to the first control point, wherein the second is the N-type transistor, and the first transistor, the third transistor and the fourth transistor are P-type transistors, wherein in a reset of the pixel circuit, the third and the fourth transistor are configured to be turned off, and the first transistor and the second transistor are configured to be turned on so that the input voltage of the reset terminal is written into the first control point and the input voltage of the reference power source terminal is written into the second control point.

2. The pixel circuit according to claim 1, wherein the power supply sub-circuit comprises:

a fifth transistor, wherein a control electrode of the fifth transistor is coupled to the second scanning terminal, a first electrode of the fifth transistor is coupled to the first power source terminal, and a second electrode of the fifth transistor is coupled to the second control point; and a sixth transistor, wherein a control electrode of the sixth transistor is coupled to the second scanning terminal, a first electrode of the sixth transistor is coupled to the third control point, and a second electrode of the sixth transistor is coupled to the fourth control point.

3. The pixel circuit according to claim 2, wherein both the fifth transistor and the sixth transistor are P-type transistors.

4. The pixel circuit according to claim 1, wherein the drive sub-circuit comprises a drive transistor, a control electrode of the drive transistor is coupled to the first control point, a first electrode of the drive transistor is coupled to the second control point, and a second electrode of the drive transistor is coupled to the third control point, wherein the threshold voltage of the drive sub-circuit is a threshold voltage of the drive transistor.

5. The pixel circuit according to claim 1, wherein the input voltage of the data terminal is greater than a differential between the input voltage of the reset terminal and a threshold voltage of the drive sub-circuit.

6. The pixel circuit according to claim 1, wherein the storage sub-circuit comprises an energy storage capacitor, an end of the energy storage capacitor is coupled to the first control point, and another end of the energy storage capacitor is coupled to the second control point.

7. The pixel circuit according to claim 1, wherein the light-emitting element comprises an organic light-emitting diode, an end of the organic light-emitting diode is coupled to the fourth control point, and another end of the organic light-emitting diode is coupled to the second power source terminal.

8. A method for driving the pixel circuit according to claim 1, comprising:

in a reset phase inputting an ON scanning signal to the first scanning terminal and the second scanning terminal and inputting an OFF scanning signal to the third scanning terminal to turn on the first transistor and the second transistor and turn off the third transistor and the fourth transistor, so as to wright a reset voltage from the reset terminal into the first control point and a first voltage from the reference power source terminal into the second control point;

in a data-writing phase, inputting an OFF scanning signal to the first scanning terminal, inputting an ON scanning signal to the third scanning terminal, inputting a data voltage to the data terminal, and inputting a reference voltage to the reference power source terminal, such that the data voltage is written into the first control point and the reference voltage is written into the second control point, wherein the data voltage of the data terminal is greater than a differential between the reset voltage of the reset terminal and the threshold voltage of the drive sub-circuit; and in a light emission phase, inputting an OFF scanning signal to the third scanning terminal, inputting an ON scanning signal to the second scanning terminal, and inputting a second voltage to the first power source terminal, such that the second voltage is written into the first control point, the third control point is communicated with the fourth control point, the drive sub-circuit discharges electricity via the light-emitting element under the control of the voltage of the first control point and the voltage of the second control point, and the light-emitting element is driven by electric current of the drive sub-circuit to emit light.

9. The method for driving a pixel circuit according to claim 8, wherein the first voltage is not equal to the reference voltage.

10. The method for driving a pixel circuit according to claim 8, wherein the power supply sub-circuit comprises a fifth transistor and a sixth transistor, the storage sub-circuit comprises an energy storage capacitor, the drive sub-circuit comprises a drive transistor, and the light-emitting element comprises an organic light-emitting diode; wherein when the ON scanning signal is inputted to the first scanning terminal and the second scanning terminal, both the first transistor and the second transistor are turned on;

when the OFF scanning signal is inputted to the first scanning terminal and the ON scanning signal is inputted to the third scanning terminal, the second transistor, the third transistor and the fourth transistor are turned on; and when the OFF scanning signal is inputted to the third scanning terminal and the ON scanning signal is inputted to the second scanning terminal, the fifth transistor, the sixth transistor and the drive transistor are turned on.

11. The method for driving a pixel circuit according to claim 10, wherein the fifth transistor, the sixth transistor and the drive transistor are P-type transistors, and wherein the second scanning terminal is further coupled to gates of the fifth and sixth transistors.

12. The method for driving a pixel circuit according to claim 11, wherein:

in the reset phase, a low level is inputted to the first scanning terminal, a high level is inputted to the second scanning terminal and the third scanning terminal, the reset voltage is inputted to the reset terminal, and the first voltage is inputted to the reference power source terminal;

in the data-writing phase, a high level is inputted to the first scanning terminal and the second scanning terminal, a low level is inputted to the third scanning terminal, the data voltage is inputted to the data terminal, and the reference voltage is inputted to the reference power source terminal; and in the light emission phase, a high level is inputted to the first scanning terminal and the third scanning terminal, a low level is inputted to the second scanning terminal, and the second voltage is inputted to the first power source terminal in the light emission phase.

13. An array substrate, comprising the pixel circuit according to claim 1.

14. A display device, comprising the array substrate according to claim 13.

* * * * *